(12) United States Patent
Rosenfeld et al.

(10) Patent No.: US 6,441,613 B1
(45) Date of Patent: Aug. 27, 2002

(54) FREQUENCY SELECTIVE PULSE

(75) Inventors: Daniel Rosenfeld; Shimon L. Panfil, both of Haifa (IL); Yuval Zur, Fort Collins, CO (US)

(73) Assignee: GE Medical Systems, Waukesha, WI (US)

( * ) Notice: Subject to any disclaimer, the term of this patent is extended or adjusted under 35 U.S.C. 154(b) by 0 days.

(21) Appl. No.: 08/916,390

(22) Filed: Aug. 22, 1997

Related U.S. Application Data

(63) Continuation-in-part of application No. 08/883,123, filed on Jun. 26, 1997.

(30) Foreign Application Priority Data

Sep. 10, 1996 (IL) .................................................. 119233

(51) Int. Cl.$^7$ ................................................ G01V 3/00

(52) U.S. Cl. ........................................ 324/314; 324/307

(58) Field of Search ................................. 324/314, 307, 324/309, 300, 306, 311, 312

(56) References Cited

U.S. PATENT DOCUMENTS

| | | | | |
|---|---|---|---|---|
| 4,695,799 A | * | 9/1987 | Hardy et al. ................. | 324/307 |
| 4,914,392 A | * | 4/1990 | Ugurbil et al. ............. | 324/309 |
| 4,988,947 A | * | 1/1991 | Ugurbil et al. ............. | 324/307 |
| 5,448,170 A | * | 9/1995 | Bodenhausen et al. ...... | 324/309 |
| 5,572,126 A | * | 11/1996 | Shinnar ....................... | 324/314 |
| 5,619,138 A | * | 4/1997 | Rourke ........................ | 324/309 |

OTHER PUBLICATIONS

Rosenfeld, Daniel, and Zur, Yuval, "A new adiabatic inversion pulse," Magnetic Resonance in Medicine, vol. 36 (1996), pp. 124–136.*

Thomas E. Skinner and Pierre–Marie L. Robitaille, "General Solution for Tailored Modulation Profiles in in Adiabatic Excitation",Journal of Magnetic Resonance 98:14–23 (1992).

Robin A. de Graaf, Klaas Nicolay and Micahel Garwood, "Single–Shot, B1–Insensitive Slice Selection with a Gradient–Modulated Adiabatic Pulse, BISS–8", Magnetic Resonance in Medicine 35:652–657 (1996).

D. Rosenfeld, S.L. Panfil and Y. Zur, "Design of Adiabatic Pulses for Fat–Suppression Using Analytic Solutions of the Bloch Equation", Magnetic Resonance in Medicine 37:793–801 (1997).

D. Rosenfeld, S. L. Panfil and Y. Zur, "Analytic Solutions of the Bloch Equation Involving Asymmetric Amplitude and Frequency Modulations", Physical Review A, 54:2439–2443 (1996).

Daniel Rosenfeld and Yuval Zur, "A New Adiabatic Inversion Pulse", Magnetic Resonance in Medicine, 36: pp.124–136 (1996).

Rosenfeld and Y. Zur, Magnetic Resonance in Medicine, 36: 401, (1996).

(List continued on next page.)

Primary Examiner—Louis Arana
(74) Attorney, Agent, or Firm—Hoffmann, Wasson & Gitler

(57) ABSTRACT

A method of NMR (nuclear magnetic resonance) excitation of a sample having a magnetic moment, including, applying a longitudinal magnetic field to the sample; and changing the magnetic moment in a substantially continuous manner by moving an effective magnetic-field vector $\omega_e$ more than 90°, wherein for all portions of the sample in which the moment is changed, the angular velocity of the effective field vector at at least one angle, 90°+α, is different from the angular velocity at 90°−α.

27 Claims, 11 Drawing Sheets

OTHER PUBLICATIONS

Steven Conolly, Dwight Nishimura and Albert Macovski, "Variable Rate Selective Excitation", Journal of Magnetic Resonance, 78: 440–458 (1988).

C.P. Slichter, "Principles of Magnetic Resonance," 3rd ed. Springer–Verlag, Berlin, 1992, pp33–35.

Jerzy Szumowski, Jane K. Eisen, Simon Vinitski, Peter W. Haake and Donald B. Plewes,"Hybrid Methods of Chemical–Shift Imaging", Magnetic Resonance in Medicine, 9:379–388, (1989).

M.S. Silver, R.I. Joseph, D.I. Hoult, "Selective Spin Inversion in Nuclear Magnetic Resonance and Coherent Optics through an Exact Solution of the Bloch–Riccati Equation," Physical Review A, 31: 2753–2755, (1985).

A. Bambini and P.R. Berman, "Analytic Solution to the Two–State Problem for a class of Coupling Potentials," Physical Review, 23:No.5: 2496–2501 (1981).

D. Rosenfeld, S. L. Panfil and Y. Zur "Optimization of Adiabatic Selective Pulses," Journal of Magentic Resonance, 126:221–228 (1997).

Thomas E. Skinner and Pierre–Marie L. Robitaille, "Adiabatic Excitation Using sin2 Amplitude and cos2 Frequency Modulation Functions," Journal of Magnetic Resonance Series A, 103: 34–39,(1993).

* cited by examiner

FREQUENCY SELECTIVE PULSE

RELATED APPLICATIONS

This application is a continuation-in-part of a U.S. patent application having filed Jun. 26, 1997 receiving Ser. No. 08/883,123, by inventors D. Rosenfeld, Y. Zur and S. L. Panfil, and titled "Fast Adiabatic Pulses," the disclosure of which is incorporated herein by reference.

FIELD OF THE INVENTION

The present invention relates to magnetic resonance imaging and in particular to the use of adiabatic pulses for changing magnetic moments.

BACKGROUND OF THE INVENTION

FIG. 1 is a schematic diagram of an MRI (Magnetic Resonance Imaging) system as well known in the art. A patient 20 is placed into a powerful, axial, homogenous magnetic field generated by a magnet 22. The tissues which make up patient 20 contain many hydrogen nuclei, some of which have magnetic moments aligned with the magnetic field. When an aligned hydrogen atom is irradiated with RF radiation of a suitable frequency, transmitted by an RF transmitter 24, its magnetic moment changes direction relative to the field. The new direction of the magnetic moment is not stable, so after a time the magnetic moment reorients itself back to the magnetic field direction. During this reorientation, the hydrogen atom emits RF radiation, which radiation is detected by RF receiver 30.

The RF radiation is generated by hydrogen nuclei which have a magnetic moment at an angle to the magnetic field, which moment precesses about the axial field direction. The RF irradiation tends to align the magnetic moments so they are all in phase with each other such that their individual contributions to the RF signal are additive.

As can be appreciated, tissues which have a high concentration of hydrogen nuclei will emit a higher amplitude of RF energy than tissues which have a low concentration of hydrogen nuclei. In addition, different body tissues can be characterized by their $T_1$ and $T_2$ relaxation times, which can be imaged using various MRI imaging sequences. Also, the emission frequency depends on the chemical bonds of the hydrogen atom, so the emission frequency can be analyzed to detect different chemicals in the body, in what is known as MRI spectroscopy.

In order to generate an image of a body portion, the spatial origin of the acquired RF signals must be determined. In a typical coordinate system the Z coordinate is in the direction of the longitudinal axis of patient 20 (and the direction of the DC magnetic field) and the X and Y axes are perpendicular to it. Some methods of MRI imaging limit the image acquisition to one slice in the X-Y plane at a time, by what is called slice selection. The RF frequency, which causes the magnetic moments of hydrogen nuclei to change their orientations, is functionally dependent on the intensity of the magnetic field. A Z gradient coil 26 imposes a gradient, in the Z direction, on the Z directed field generated by magnet 22, so that each axial slice of patient 20 is subjected to a different Z-directed magnetic field. RF transmitter 24 transmits a narrow band RF signal, which affects the orientation of hydrogen nuclei in only a narrow body portion (slice) 27 and hence causes emission of RF radiation from portion 27 alone.

In order to differentiate between RF signals emitted by different segments of portion 27, a Y gradient coil 32 is typically used to momentarily create a Y gradient in the Z directed magnetic field of magnet 22. This Y gradient is created before readout, described below. Nuclei in segments of portion 27 which have a momentary increase in the locally applied magnetic field advance in phase, since the precession speed is dependent on the field strength, while nuclei which have a momentary decrease in the locally applied magnetic field retreat in their phase. Thus, portion 27 is divided into first parallel strips (in the Y direction), each of which emits RF radiation at a different phase.

The X coordinate of an RF emission is determined during a stage called readout. To perform readout, the Z directed magnetic field including portion 27 is varied in the X direction, using an X gradient coil 28, so that portion 27 is substantially divided into second parallel strips (in the X direction) each of which has a different local magnetic field strength. Since the frequency of the emitted RF radiation is directly dependent on the local field intensity, each of the second parallel strips emits radiation at a different frequency. An image can be reconstructed by acquiring a plurality of RF signals during readout, each of which has a different Y gradient phase encoding and a X gradient frequency encoding, and performing a two-dimensional FFT (fast Fourier transform) on the acquired signals. It should be appreciated that many different types of MRI imaging sequences are known in the art, including sequences where the imaged nucleus is not Hydrogen.

FIG. 2A is a schematic diagram showing the interaction between a magnetic moment 40 of a sample and a static Z magnetic field 42 having a magnitude $B_0$. Field 42 causes magnetic moment 40 to become aligned with the +Z direction and to spin at an angular velocity $\omega_0 = \gamma B_0$ around the Z direction, where y is the gyromagnetic ratio of the inspected nucleus. $\omega_0$ is also called the Larmor frequency. FIG. 2B illustrates an example where moment 40 is also subjected to an RF magnetic field 44 having a magnitude $B_1$ and a frequency $\omega$. The most convenient frame of reference in which to describe the effect of RF field 44 is a rotating frame of reference, having an origin coinciding with moment 40 and rotating in the X-Y plane at an angular velocity $\omega$. The following description is based on such a rotating frame. The total interaction between RF field 44, static field 42 and moment 40 may be described by an effective magnetic field vector $B_{eff}$ which interacts with moment 40. $B_{eff}$ created by RF field 44 comprises an X-component $\gamma B_1$ (which defines the component of $B_{eff}$ in the X-Y plane) and a Z component $\Delta\omega = \omega - \omega_0$. The interaction between $B_{eff}$ and moment 40 is such that moment 40 precesses around $B_{eff}$ at an angular frequency $|\gamma B_{eff}|$. RF field 44 has X, Y and Z components. However, the RF field component in the Z direction generally has a smaller magnitude than $B_0$, so it may be ignored.

The effect of a (varying) RF magnetic field on a magnetic moment is generally described by a well known differential equation, the Bloch equation, which is described in detail in C. P. Slichter, "Principles of Magnetic Resonance," 3rd ed. Springer-Verlag, Berlin, 1992, the disclosure of which is incorporated herein by reference. The following description is correct for short time scales (pulse duration is shorter than a typical $T_2$ of the human tissues), where the relaxation terms in the Bloch equation may be ignored.

When combining the effects of RF field 44 and static field 42, notice must be taken of the relationship between $\omega$ and $\omega_0$. FIG. 3 shows the case where $\omega = \omega_0$. In this case, the $B_{eff}$ interacting with moment 40 is wholly in the X direction (with an amplitude determined by the amplitude of RF field 44). The effect of such a vector on moment 40 is that moment 40 precesses around the X axis (i.e., in the Z-Y plane in the case that moment 40 was originally aligned with the +Z direction).

In MRI terminology, a pulse using an RF field with $\omega=\omega_0$ is called an AM pulse. This type of pulse has a frequency, equal to the Larmor frequency ($\omega_0$). Its amplitude changes with time. An AM pulse may be used to effect inversion of a moment 40, which moment is originally aligned with the Z direction, in the following manner: an RF field 44 having a known strength is applied to moment 40; and once moment 40 has made a 180° rotation (in the Y-Z plane), i.e., moment 40 is inverted, RF field 44 is turned-off.

The precession velocity of moment 40 about rotating axis X is linearly dependent on the amplitude of RF field 44. An important result of this linear dependency is the sensitivity of the AM pulse to RF field inhomogenities, which may be characteristic of an RF coil which generates RF field 44 or by local inhomogenities caused by the sample being imaged. As an example of this sensitivity to field inhomogenities, if two similar samples are subjected to the same RF pulse duration but the RF field is 120% as intense at one sample than at the other sample, the magnetic moment of one sample will complete 216° of rotation, while the magnetic moment of the other sample will complete 180° of rotation.

The effect of an RF field which is not at the Larmor frequency can be appreciated by comparison with the effect of an AM pulse. In general, an AM inversion pulse operates by rotating moment 40 by 180° in a plane perpendicular to $B_{eff}$. Normally, this plane is the Y-Z plane, since $B_{eff}$ is aligned with the X direction. Referring back to FIG. 2B, if $\Delta\omega$ is small, moment 40, rotated 180° around $B_{eff}$ is still substantially aligned with the Z axis. However, if $\Delta\omega$ is large, moment 40 will not be aligned with the Z axis after the inversion (it will point somewhere else in space), and as such cannot be considered inverted. This effect of off-resonance frequencies on the inversion characteristics of moment 40 can be used for slice selection, where a Z gradient field is applied to a sample during RF irradiation, so that only one slice of the sample is irradiated at its Larmor frequency. Thus, only a portion of the sample (the slice) is properly inverted by the RF irradiation, while other portions are only partially inverted (or not inverted at all).

An FM pulse utilizes an RF field having a varying frequency to invert the magnetic moments in a sample even in the presence of RF field inhomogeneities. FIG. 4 illustrates the effect of an FM pulse on inversion of a magnetic moment. $B_{eff}$ at the start of the pulse is aligned with the Z direction and very slowly moves to the -Z direction along a trajectory 46 (i.e., $\theta$ changes slowly). The term trajectory is used to describe the path traced by the tip of vector $B_{eff}$ throughout the pulse. Mathematically, this describes the functional dependence between $\Delta\omega$ and $\gamma B_1$. If the movement of $B_{eff}$ is slow enough, moment 40 will follow the movement of $B_{eff}$ until $B_{eff}$ is aligned with the -Z direction. The term "very slow" means that the precession velocity ($|\gamma B_{eff}|$) is much larger than the angular velocity of $B_{eff}, \dot\theta$. Mathematically this is formulated by the adiabatic condition as $|\gamma B_{eff}| >> |\dot\theta|$.

FM pulses of this type are commonly called adiabatic pulses, since the (slow) movement of the precession axis $B_{eff}$ has little effect on the (fast) precession of moment 40 about it. One important result of this adiabatic condition is that the inversion is substantially insensitive to the strength of RF field 44, within certain limits. Increasing the strength of RF field 44 by 10% will cause $B_{eff}$ to follow a trajectory 47 instead of trajectory 46. This change in trajectory will have negligible effect on the inversion, since the strength of RF field 44 affects mainly the precession velocity of the moment and has a small effect on the angular velocity $\dot\theta$ of $B_{eff}$. So long as the adiabatic condition is fulfilled, the FM pulse will operate (invert moment 40) in substantially the same manner. As can be appreciated, a magnetic moment will be inverted by an adiabatic FM pulse if (a) the magnetic moment is "captured" by $B_{eff}$ so that it tracks $B_{eff}$, and (b) the magnetic moment does not "escape" $B_{eff}$ prematurely. This requires that the adiabatic condition be fulfilled over the entire duration of the FM pulse.

Solutions of the Bloch equation can be used to describe RF pulses which invert magnetic moments. One very important characteristic of inversion pulses is their frequency selectivity. If an inversion pulse is very frequency sensitive (selective), it can be used to define a slice with sharp boundaries (slice selection, described above). The degree of frequency selectivity is an important parameter of the resolution possible in an MRI system (which resolution is NOT dependent on the wavelength of the radiation). In addition, a highly selective pulse can be used to selectively invert Hydrogen nuclei associated with different materials in a single slice, where each material has a different $\omega_0$.

One case where frequency selection is important is in imaging the breast, where it is desirable to suppress the contribution of adipose tissue so that the signal to noise ratio of water based tissues is improved. In some cases, suppression of silicone implants is also desirable. FIG. 7 is a graph showing the relationship between the Larmor frequencies of fat and of water. It should be appreciated that the difference between the peaks is only 3.5 ppm (parts per million). FIG. 8 shows a pulse/gradient sequence in which fat is suppressed. An inversion pulse 50, which is very frequency selective, so that it only inverts fat in the slice, is applied to the tissue. After a waiting period 52 (dependent on the $T_1$ relaxation time of the fat), in which a sharp gradient called a spoiler gradient may be applied, the magnetic moment of the fatty tissue is substantially zero (neither +Z nor -Z). At this point in time an imaging sequence 54 is applied for imaging the tissue, in which sequence the radiation emitted by adipose tissue is substantially reduced.

It can be appreciated that fat inversion pulses should be highly frequency selective, so that they can distinguish between the proximal water and fat Larmor frequencies. "Hybrid Methods of Chemical-Shift Imaging", by Jerzy Szumowski, Jane K. Eisen, Simon Vinitski, Peter W. Haake and Donald B. Plewes, in "Magnetic Resonance in Medicine" vol. 9, pp. 379–388, published by Academic Press, Inc., 1989, the disclosure of which is incorporated by reference, describes several frequency selective imaging methods for suppressing fat. In one method, shown in FIG. 2 of the above paper, the amplitude of the water signal is detrimentally affected by the fat suppression.

Frequency selection in AM pulses, by the effects of off-resonance irradiation, has been described above with respect to FIG. 2B. Off-resonance behavior of FM inversion pulses can be divided into three types: inversion (FIG. 5), transition (FIG. 6A) and non-inversion (FIG. 6B). FIG. 5 shows the effect of an FM pulse on a sample, where the sample is slightly off-resonance (the Larmor frequency is slightly different from the RF frequency about which the inversion pulse is designed). The result is that trajectory 46 is shifted along the Z axis to a new trajectory 60. It can be appreciated that trajectory 60 still maintains the adiabatic condition, namely, that $\dot\theta$ is much smaller than the precession velocity. Thus, the inversion pulse still functions in many cases of small off-resonances, such as in small variations in the static magnetic field.

FIG. 6A shows the transition behavior of the pulse. Trajectory 46 is shifted to a new trajectory 62. Attention is directed to a region 64 of trajectory 62. In region 64, the magnitude of $B_{eff}$ is considerably increased while θ varies slightly relative to a corresponding region of trajectory 46, so the adiabatic condition is still fulfilled. As a result, "capture" by and tracking of $B_{eff}$ by moment 40 is facilitated. However, in a region 66 of trajectory 62, the magnitude of $B_{eff}$ is significantly smaller than in the corresponding portion of trajectory 46, thereby violating the adiabatic condition. As a result, a magnetic moment which is too far from resonance will stop tracking and "escape" from $B_{eff}$. In the other off-resonance condition, where trajectory 46 is shifted in the −Z direction, off-resonance nuclei will stop tracking at the beginning of the trajectory, as soon as the adiabatic condition is violated. Thus, when the sample is too far off-resonance, the pulse will not properly invert the sample.

FIG. 6B shows the non-inversion behavior of the pulse at large off-resonances. When trajectory 46 is shifted far enough away from its original position (as shown in FIG. 4) to a new trajectory 67, the FM pulse is once again adiabatic. However, the operation of the pulse in this case is non-inverting, since the moment is shifted away from the +Z axis and then back again to the +Z axis.

The range of frequencies over which the pulse changes from an inverting pulse to a non-inverting pulse is called the transition. Narrow transitions imply sharp slice selections.

One FM pulse which has excellent RF field inhomogeneity stability and has a narrow transition is a sech/tanh pulse. The sech/tanh pulse is further described in M. S. Silver, R. I. Joseph and D. I. Hoult, "Selective Spin Inversion in Nuclear Magnetic Resonance and Coherent Optics through an Exact Solution of the Bloch-Riccati Equation," Physical Review A, Vol. 31, pp. 2753–2755, 1985, the disclosure of which is incorporated herein by reference. "Sech/tanh" is a notation which describes the modulation functions of $\gamma B_1$ and $\Delta \omega$ (respectively) as a function of time (which determine $B_{eff}$ with respect to a certain Larmor frequency). The trajectory of a sech/tanh pulse is a half-ellipse, as is the trajectory of a sin/cos pulse. In an AM pulse, where only the amplitude is varied, only one component (the $\gamma B_1$ component) is described, e.g., a "sinc" pulse. FIG. 9 shows the frequency selection profile of a sech/tanh pulse having a transition region 68, an inverted region 70 and a non-inverted region 71. Two important parameters of the inversion pulse are the transition and inversion bandwidths.

The adiabatic condition can also be affected by the duration of the FM pulse. In a fast pulse the angular velocity of $B_{eff}$ is higher than in an otherwise similar slow pulse, since the same trajectory is traversed in less time. If the angular velocity is higher, the transition width is increased compared to a slower pulse, since the faster pulse is less adiabatic.

"Analytic Solution to the Two-State Problem for a class of Coupling Potentials," by A. Bambini and P. R. Berman, in "Physical Review", Vol. 23, No. 5, pp. 2496–2501, published by the American Physical Society, May 1981, the disclosure of which is incorporated herein by reference, describes an AM pulse with an asymmetric temporal envelope which results in an asymmetric frequency response.

SUMMARY OF THE INVENTION

One object of some embodiments of the present invention is to provide a method of achieving narrower transitions in MRI adiabatic inversion pulses. In one embodiment of the invention this is achieved by providing an inversion pulse having an asymmetric magnetization profile. Thus, one transition is narrower than the other transition. Preferably, the pulse can be controlled to effect a trade off between the widths of the two transitions.

Another object of some embodiments of the present invention is to provide a method of selective fat inversions, whereby a pulse having asymmetric magnetization is configured so that its narrow transition area falls in between the Larmor frequencies of water and fat. Thus, one is inverted and the other is not.

In some embodiments of the invention, an asymmetric magnetization profile is achieved using an asymmetric pulse. This type of pulse is preferably asymmetric in that the angular velocity of the effective magnetization filed vector is not mirrored through 90° for any of the in-slice regions, for at least some of the angles. Preferably, at least 10% of the angles have asymmetric angular velocities. Alternatively, at least 20% of the angles are not mirrored. Alternatively, at least 40% of the angles are not mirrored. Alternatively, at least 70%, or even 80% of the angles are not mirrored.

In accordance with a preferred embodiment of the present invention, a more general solution of the Bloch equation is provided which may be used to design NMR/MRI pulses and which incorporates previous known solutions such as certain AM pulses and the sech/tanh pulse. This solution was obtained by solving a hyper-geometric equation derived from the Bloch equation, hence, the new pulse is designated a hyper-pulse.

The solution is best described with respect to a reference frame which is rotating at the instantaneous frequency of the RF pulse. A pulse, designed in accordance with such a solution, has an effective magnetic-field vector $\omega_e = \gamma B_{eff} = (\omega_1(t), 0, \omega(t) - \omega_0)$. The components are given by the following parametric equations in z:

$$\omega_x = \omega_1 = \Omega_0 \frac{\sqrt{z(1-z)}}{az+b} \quad (1)$$

$$\omega_y = 0$$

$$\omega_z = \omega - \omega_0 = \frac{cz+d}{az+b} - \omega_0 = \Delta\omega$$

where a, b, c, d and $\Omega_0$ are parameters (real numbers). The time variable t is mapped by the variable z. When z advances from 0 to 1, t advances from −∞ to +∞. Variables t and z are related by the following equation:

$$t = \ln \frac{z^b}{(1-z)^{a+b}} \quad (2)$$

The final distribution of the magnetization in the sample, assuming the initial magnetization of the sample was at equilibrium in the Z direction; is:

$$M_z = \frac{\sinh \pi r \sinh \pi v + \cos 2\pi q}{\cosh \pi r \cosh \pi v} \quad \text{where} \quad (3)$$

$$r = d - \omega_0 b \quad (4)$$

$$v = (c+d) - \omega_0(a+b)$$

$$q = \frac{1}{2}\sqrt{\Omega_0^2 - (c - \omega_0 a)^2}$$

It should be noted that q may be an imaginary number, in which case, the cosine in equation (3) becomes a hyperbolic cosine. $M_z$ is normalized to $M_0$, the initial magnetization in the +Z direction.

If a=0, the solution results in a sech/tanh pulse. If c=d=0, the solution is an AM pulse. However, as can be seen, these two solutions are only specific solutions.

In accordance with another preferred embodiment of the invention, asymmetric inversion pulses are provided. Such pulses may be based on asymmetric solutions of the above hyper solutions. Asymmetric hyper-solutions result when parameter a is not zero. The magnetization profiles of asymmetric pulses are characterized as having a narrow transition (magnetization changes rapidly with frequency) and a broad transition (magnetization changes slowly with frequency). Two asymmetric solutions can be mirror images, with one having a narrow transition on the lower frequencies and one having a narrow transition on the higher frequencies. The inventors have determined that the narrow transition of a hyper pulse can be as narrow as ⅔ of the width of a sech/tanh pulse of a similar duration. In particular, over the range 1<a/b<500, a similar duration hyper-pulse has a narrow transition which is at least 20% narrower than a transition of a corresponding sech/tanh pulse. This is possible, because the width of one transition may be traded of with the width of the other transition, so it is possible to achieve narrow transition widths only where they are needed and not where they are not needed.

An FM pulse having a narrow transition is very useful. The following uses include a partial list of applications for such a pulse. Thus, an asymmetric pulse may be used for:

(a) fat suppression, as described above;
(b) population inversion, using a shorter duration pulse;
(c) population inversion, using a weaker Z gradient field;
(d) frequency selective inversion, for example, in NMR/MRI spectroscopy;
(e) inversion pulses of tip angles other than 180°, such as 90°;
(f) slice selection where a sharply defined border is required, such as in blood suppression in MRI angiography; and
(g) increased definition in MRI microscopy.

In accordance with another aspect of the present invention, the peak RF amplitude of the pulse is reduced from what would otherwise be necessary to yield the fastest transition. Moreover, the inventors have determined that, the peak amplitude requirement may be substantially reduced without overly increasing the width of the narrow transition.

There is therefore provided in accordance with a preferred embodiment of the invention a method of NMR (nuclear magnetic resonance) excitation of a sample having a magnetic moment, including:

applying a longitudinal magnetic field to the sample; and
changing the magnetic moment in a substantially continuous manner by moving an effective magnetic-field vector $\omega_e$ more than 90°, where for all portions of the sample in which the moment is changed, the angular velocity of the effective field vector at at least one angle, 90°+α, is different from the angular velocity at 90°−α. Preferably, changing the moment includes rotating the moment by approximately 180 degrees. Preferably, moving the magnetic-field vector includes applying an FM pulse and vector $\omega_e$ has components $\omega_x$, $\omega_y$ and $\omega_z$ and changing includes changing according to the following formula:

$$\omega_x = \omega_1 = \Omega_0 \frac{\sqrt{z(1-z)}}{az+b}$$

$$\omega_y = 0$$

$$\omega_z = \omega - \omega_0 = \frac{cz+d}{az+b} - \omega_0$$

where, the frame of reference for the formula is a frame rotating at the instantaneous frequency of the FM pulse and where z is selected from the range 0 to 1 and where a time variable t is given by:

$$t = \ln \frac{z^b}{(1-z)^{a+b}}$$

where a, b, c, d and $\Omega_0$ are parameters having real values and where at least one of a, b, c, d, and $\Omega_0$ are changed during the pulse. Preferably, c≠0 or d≠0.

In a preferred embodiment of the invention, vector $\omega_e$ has components $\omega_x$, $\omega_y$ and $\omega_z$ and changing includes changing according to the following formula:

$$\omega_x = \omega_1 = \Omega_0 \frac{\sqrt{z(1-z)}}{az+b}$$

$$\omega_y = 0$$

$$\omega_z = \omega - \omega_0 = \frac{cz+d}{az+b} - \omega_0$$

where, the frame of reference for the formula is a frame rotating at the instantaneous frequency of the FM pulse and where z is selected from the range 0 to 1 and where a time variable t is given by:

$$t = \ln \frac{z^b}{(1-z)^{a+b}}$$

where a, b, c, d and $\Omega_0$ are parameters having real values and where a≠0, and (c≠0 or d≠0).

Preferably, 1≤a/b≤1000. More preferably, 5≤a/b≤500. Further preferably, a/b is substantially equal to 11.09.

Preferably, changing the moment includes, moving the effective magnetic field vector both forwards and backwards.

There is also provided in accordance with a preferred embodiment of the invention a method of NMR (nuclear magnetic resonance) excitation of a sample having a magnetic moment, including:

applying a longitudinal magnetic field to the sample;
changing the magnetic moment in a continuous manner using an FM pulse; and
varying an effective magnetic-field vector $\omega_e$ having components $\omega_x$, $\omega_y$ and $\omega_z$ and associated with the FM pulse, according to the following formula:

$$\omega_x = \omega_1 = \Omega_0 \frac{\sqrt{z(1-z)}}{az+b}$$

$$\omega_y = 0$$

$$\omega_z = \omega - \omega_0 = \frac{cz+d}{az+b} - \omega_0$$

where, the frame of reference for the formula is a frame rotating at the instantaneous frequency of the FM pulse and where z is selected from the range 0 to 1 and where a time variable t is given by:

$$t = \ln \frac{z^b}{(1-z)^{a+b}}$$

where a, b, c, d and $\Omega_0$ are parameters having real values and where a≠0, and (c≠0 or d≠0).

Preferably, 1≦a/b≦1000. More preferably, 5≦a/b≦500. Further preferably, a/b is substantially equal to 11.09.

These is also provided in accordance with a preferred embodiment of the invention a method of NMR (nuclear magnetic resonance) excitation of a sample having a magnetic moment, including:

applying a longitudinal magnetic field to the sample; and
inverting the magnetization of at least a portion of the sample using an FM pulse having a duration, where a resulting magnetization profile $M_z$ of the sample has at least a narrow transition and a broad transition.

Preferably, the magnetization profile has the formula $$M_z = \frac{\sinh \pi r \sinh \pi v + \cos 2\pi q}{\cosh \pi r \cosh \pi v} \quad \text{where,}$$

$$r = d - \omega_0 b$$

$$v = (c+d) - \omega_0(a+b)$$

$$q = \frac{1}{2}\sqrt{\Omega_0^2 - (c - \omega_0 a)^2}$$

where a, b, c, d and $\Omega_0$ are parameters having real values, $\omega_0$ is the Larmor frequency and where a≠0, and (c≠0 or d≠0), where if q is imaginary, $$M_z = \frac{\sinh \pi r \sinh \pi v + \cosh 2\pi |q|}{\cosh \pi r \cosh \pi v}.$$

Preferably, the width of the narrow transition is less than 0.9 of the width of a transition of a sech/tanh pulse having a similar duration and a narrowest possible transition. Further preferably, the width of the narrow transition is less than 0.75 of the width of a transition of a sech/tanh pulse having a similar duration and a narrowest possible transition. More preferably, the width of the narrow transition is less than 0.68 of the width of a transition of a sech/tanh pulse having a similar duration and a narrowest possible transition.

Preferably, the duration of the pulse is less than 0.9 of the duration of a sech/tanh pulse having a similar transition width thereto. More preferably, the duration of the pulse is less than 0.75 of the duration of a sech/tanh pulse having a similar transition width thereto. Further preferably, the duration of the pulse is less than 0.68 of the duration of a sech/tanh pulse having a similar transition width thereto.

Preferably, RF radiation emitted by the sample is detected after the moment is changed.

There is also provided in accordance with a preferred embodiment of the invention, a method of NMR (nuclear magnetic resonance) excitation of a sample having a magnetic moment and including a first material having nuclei associated thereto and at least a second material having nuclei associated thereto, including:

selectively changing the magnetic moment of only the nuclei associated with the first material using the methods described above. Preferably, an NMR/MRI sequence is applied to the sample after the magnetic moment of the nuclei associated with the first material is substantially zero. Preferably, the first material consists essentially of fat. Alternatively, the first material consists essentially of water. Further alternatively, the first material consists essentially of silicon.

There is also provided in accordance with a preferred embodiment of the invention, a method of creating an asymmetric pulse from an adiabatic FM pulse having modulation functions and an angular velocity profile, including, multiplying at least one modulation function by an asymmetric function.

There is also provided in accordance with a preferred embodiment of the invention, a method of creating an asymmetric pulse from an adiabatic FM pulse having modulation functions and an angular velocity profile, including, multiplying the angular velocity profile by an asymmetric function.

There is also provided in accordance with a preferred embodiment of the invention, a method of creating an asymmetric pulse from an adiabatic FM pulse having modulation functions and an angular velocity profile, including, optimizing at least one modulation function in an asymmetric manner.

There is also provided in accordance with a preferred embodiment of the invention, a method of creating an asymmetric pulse from an adiabatic FM pulse having modulation functions and an angular velocity profile, including, optimizing the angular velocity profile in an asymmetric manner.

Preferably, the asymmetric pulse has an effective magnetic field vector and the vector sweeps both forwards and backwards.

BRIEF DESCRIPTION OF THE DRAWINGS

The invention will be more clearly understood from the following description of preferred embodiments thereof in conjunction with the following drawings in which.

DETAILED DESCRIPTION OF THE PREFERRED EMBODIMENTS

In accordance with a preferred embodiment of the invention, asymmetric pulses are provided in which the width of one of two transition areas may be traded off with the width of the other transition area and/or the duration of the pulse. Preferably, such a pulse is used for fat inversion, where the narrow transition is positioned between the frequencies for fat and water, so that when the pulse is applied, only one of the fat and water will be inverted.

In accordance with a preferred embodiment of the present invention, a more general solution of the Bloch equation is provided which may be used to design NMR/MRI pulses and which incorporates previous known solutions such as certain AM pulses and the sech/tanh pulse. This solution was obtained by solving a hyper-geometric equation derived from the Bloch equation, hence, the new pulse is designated a hyper-pulse. Some of these solutions define asymmetric pulses, in an analytical manner.

The solution is best described with respect to a reference frame which is rotating at the instantaneous frequency of the RF pulse. A pulse, designed in accordance with such a solution, has an effective magnetic-field vector $\omega_e = \gamma B_{eff} = (\omega_1(t), 0, \omega(t) - \omega_0)$. The components are given by the following parametric equations in z:

$$\omega_x = \omega_1 = \Omega_0 \frac{\sqrt{z(1-z)}}{az+b} \quad (1)$$

$$\omega_y = 0$$

$$\omega_z = \omega - \omega_0 = \frac{cz+d}{az+b} - \omega_0 = \Delta\omega$$

where a, b, c, d and $\Omega_0$ are parameters (real numbers). The time variable t is mapped by the variable z. When z advances from 0 to 1, t advances from $-\infty$ to $+\infty$. Variables t and z are related by the following equation:

$$t = \ln \frac{z^b}{(1-z)^{a+b}} \quad (2)$$

The final distribution of the magnetization in the sample, assuming the initial magnetization of the sample was at equilibrium in the Z direction:

$$M_z = \frac{\sinh \pi r \sinh \pi v + \cos 2\pi q}{\cosh \pi r \cosh \pi v} \quad \text{where} \quad (3)$$

$$r = d - \omega_0 b \quad (4)$$

$$v = (c+d) - \omega_0(a+b)$$

$$q = \frac{1}{2}\sqrt{\Omega_0^2 - (c - \omega_0 a)^2}$$

It should be noted that q may be an imaginary number, in which case, the cosine in equation (3) becomes a hyperbolic cosine. $M_z$ is normalized to $M_0$, the initial magnetization in the +Z direction.

If a=0, the solution results in a sech/tanh pulse. If c=d=0, the solution is an AM pulse. However, as can be seen, these two solutions are only specific solutions.

Figure 10A:
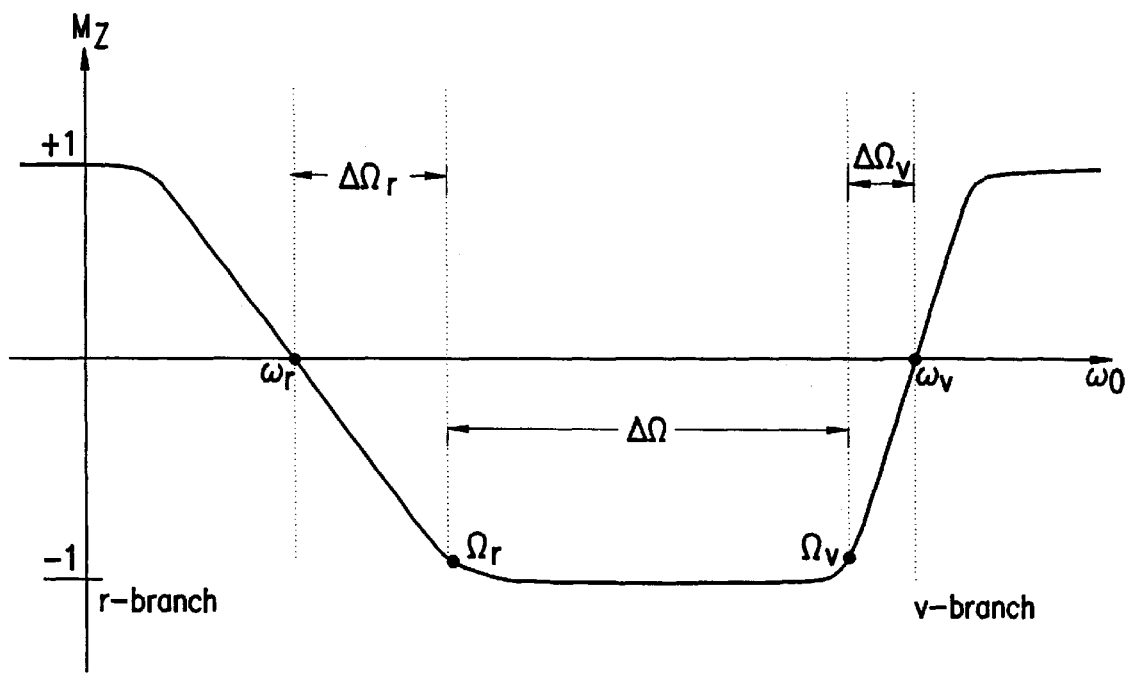
FIG. 10A is a graph of the magnetization effect of an asymmetric adiabatic FM hyper-pulse in accordance with a preferred embodiment of the invention.

FIG. 10A is a schematic graph of the final distribution of magnetization caused by an asymmetric adiabatic FM hyper-pulse in accordance with a preferred embodiment of the invention. Asymmetric pulses are generated when parameter a≠0. The magnetization is characterized by two transitions, a first transition called the r-branch (see equations (3) and (4)), has a transition half-width $\Delta\Omega_r$, a central frequency $\omega_r$ and an upper frequency $\Omega_r$. The second transition, the v-branch (equations (3) and (4)), has a transition half-width $\Delta\Omega_v$, a central frequency $\omega_v$ and a lower frequency $\Omega_v$. The inverted bandwidth is defined by $\Omega_r$ and $\Omega_v$ has a width $\Delta\Omega = \Omega_v - \Omega_r$.

Figure 1:
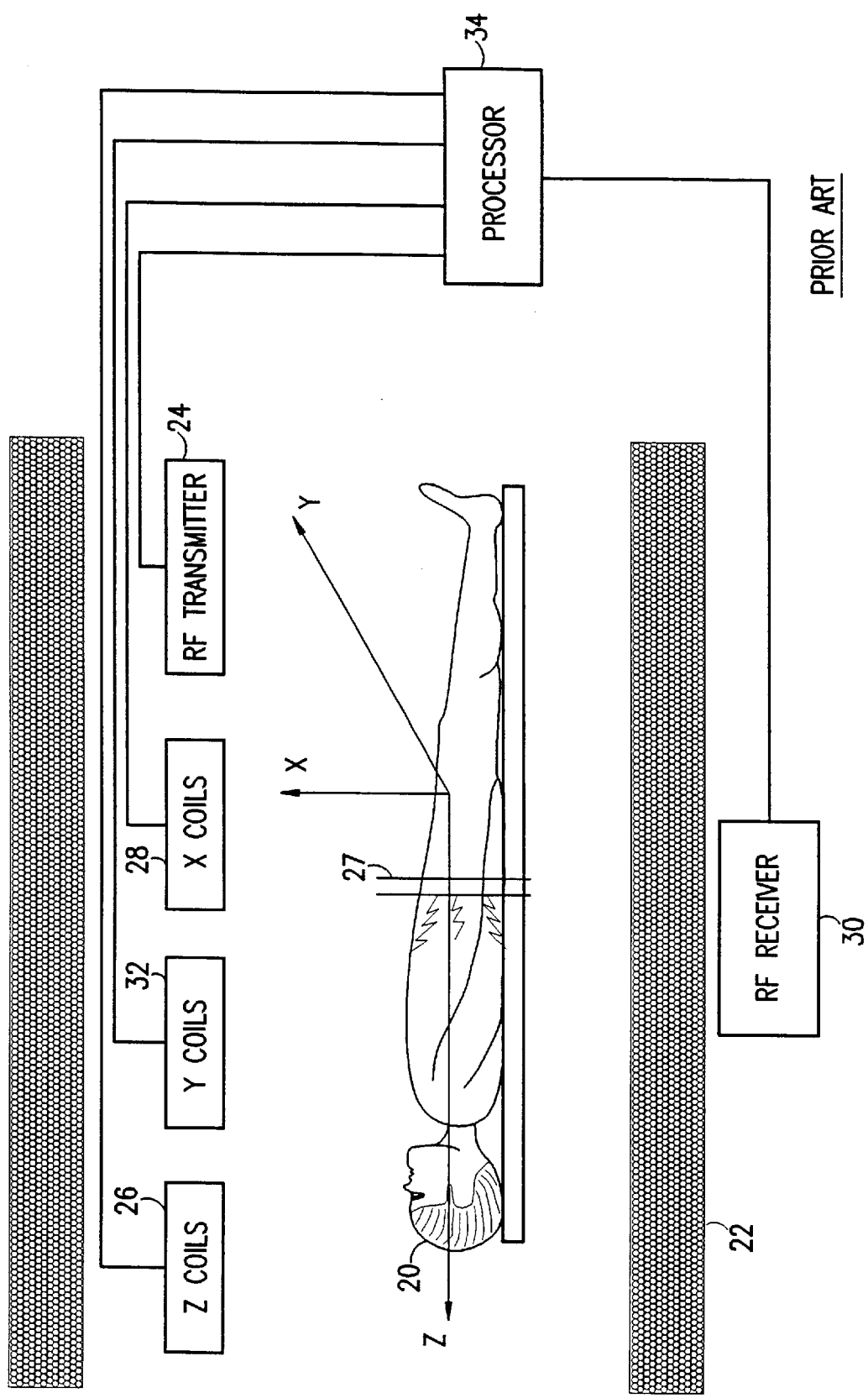
FIG. 1 is a schematic diagram of a prior art MRI system.
Figure 2A:
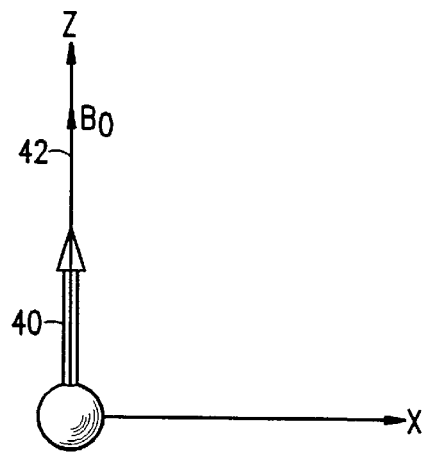
FIG. 2A is a schematic diagram showing the interaction between a magnetic moment of a sample and a static Z-directed magnetic field.
Figure 2B:
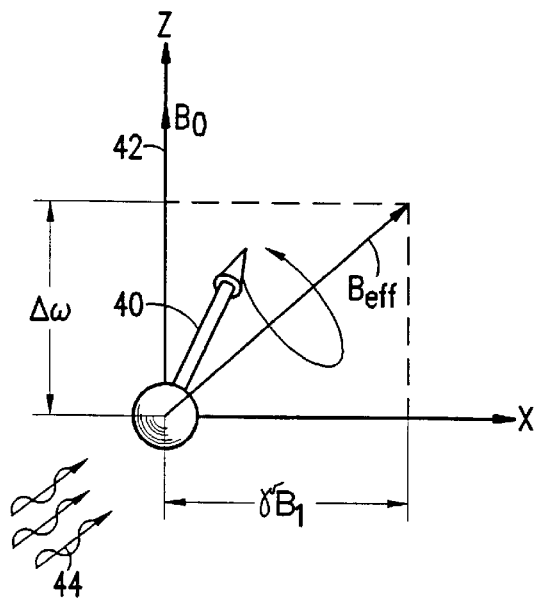
FIG. 2B is a schematic diagram showing the effect of an additional RF magnetic field on the sample of FIG. 2A.
Figure 3:
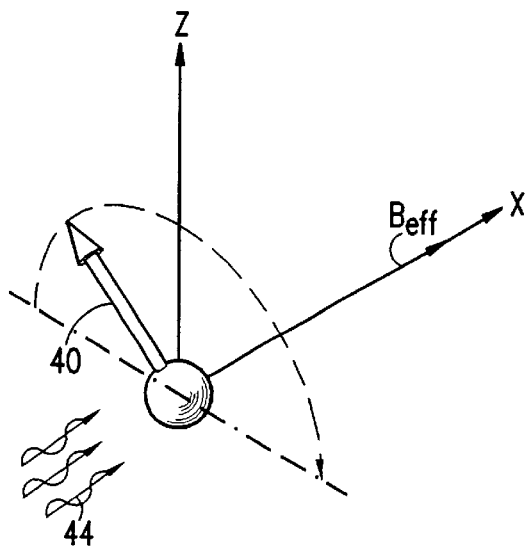
FIG. 3 is a schematic diagram illustrating the effect of an AM inversion pulse on the magnetic moment of FIG. 2A.
Figure 4:
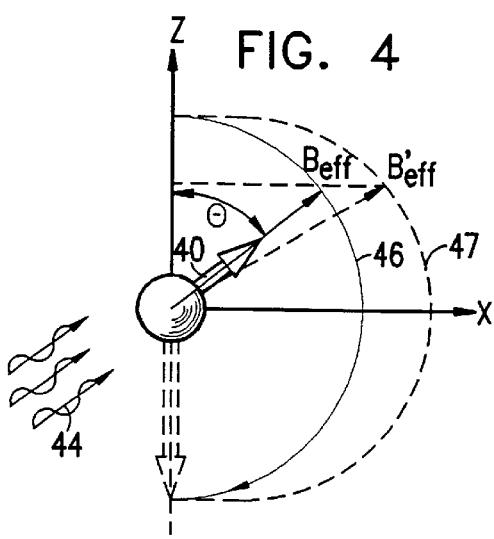
FIG. 4 is a schematic diagram illustrating the effect of an FM inversion pulse having a trajectory on the magnetic moment of FIG. 2B.
Figure 5:
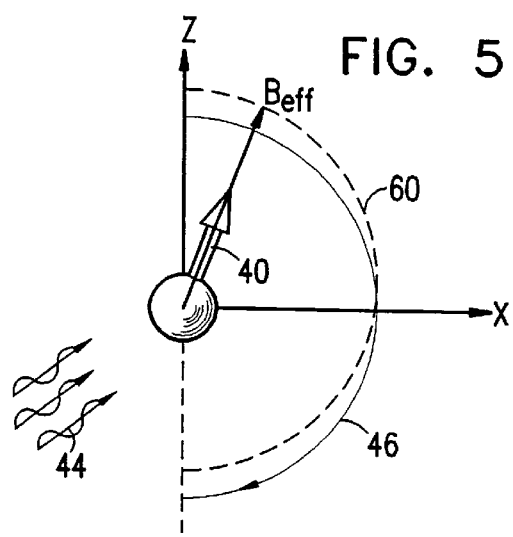
FIG. 5 is a schematic diagram illustrating a trajectory of a $B_{eff}$ which interacts with a magnetic moment which is within the inversion bandwidth, but at a slight off-resonance relative to FIG. 4.
Figure 6A:
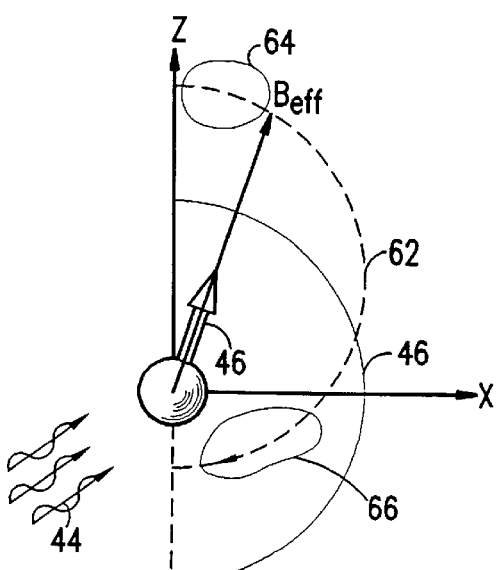
FIG. 6A is a schematic diagram illustrating a trajectory of a $B_{eff}$ which interacts with a magnetic moment which is within the transition bandwidth.
Figure 6B:
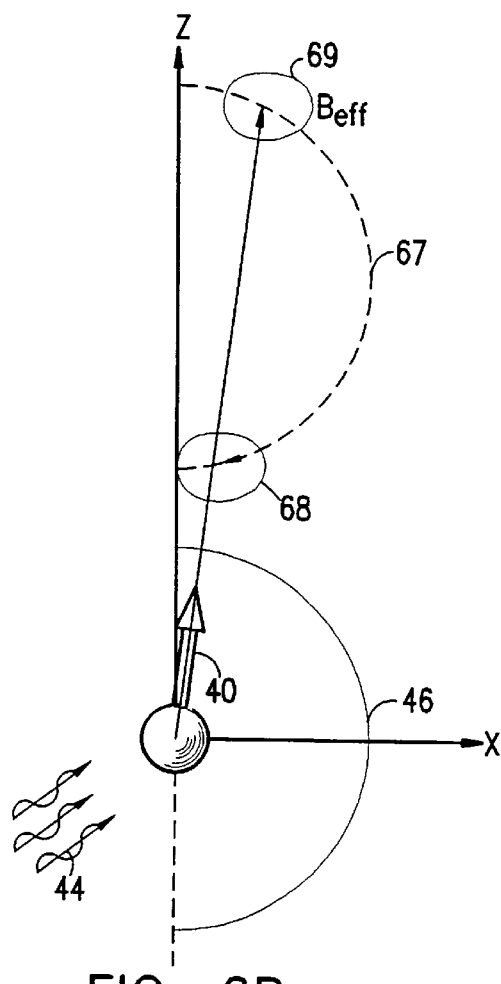
FIG. 6B is a schematic diagram illustrating a trajectory of a $B_{eff}$ which interacts with a magnetic moment which is within the non-inversion region.
Figure 7:
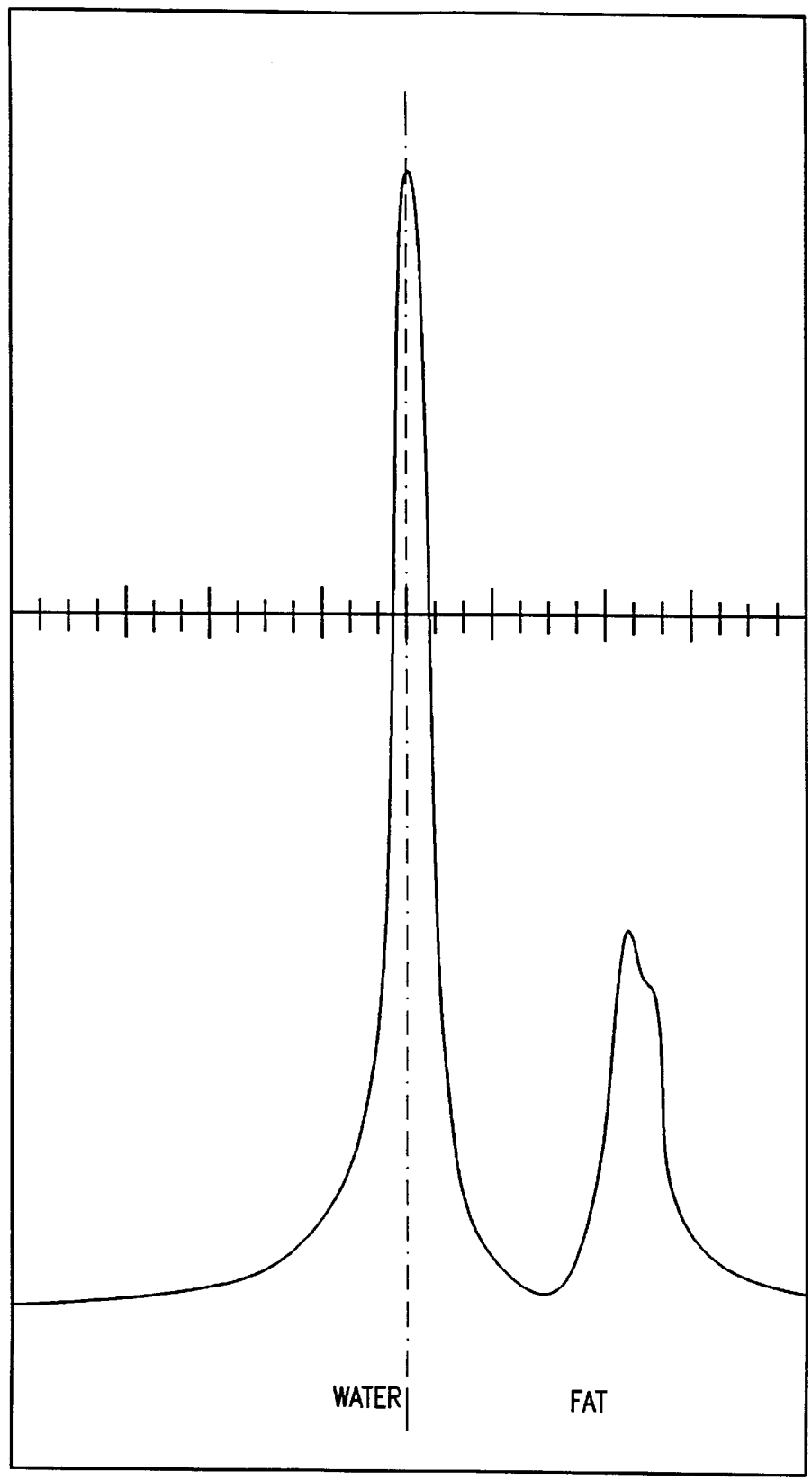
FIG. 7 is a graph showing the difference in Larmor frequencies between water and fat.
Figure 8:
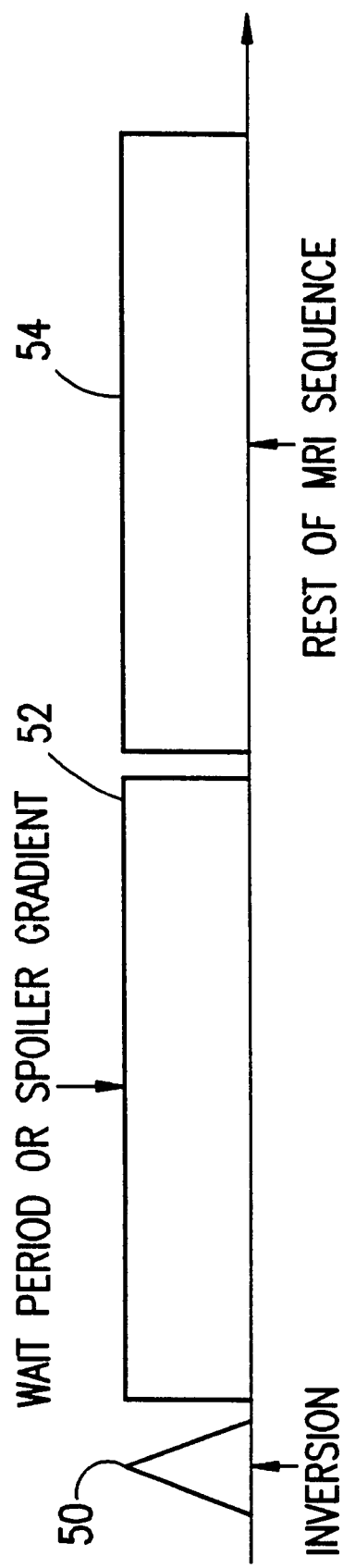
FIG. 8 illustrates a pulse/gradient sequence for suppressing fat in an MRI image.
Figure 9:
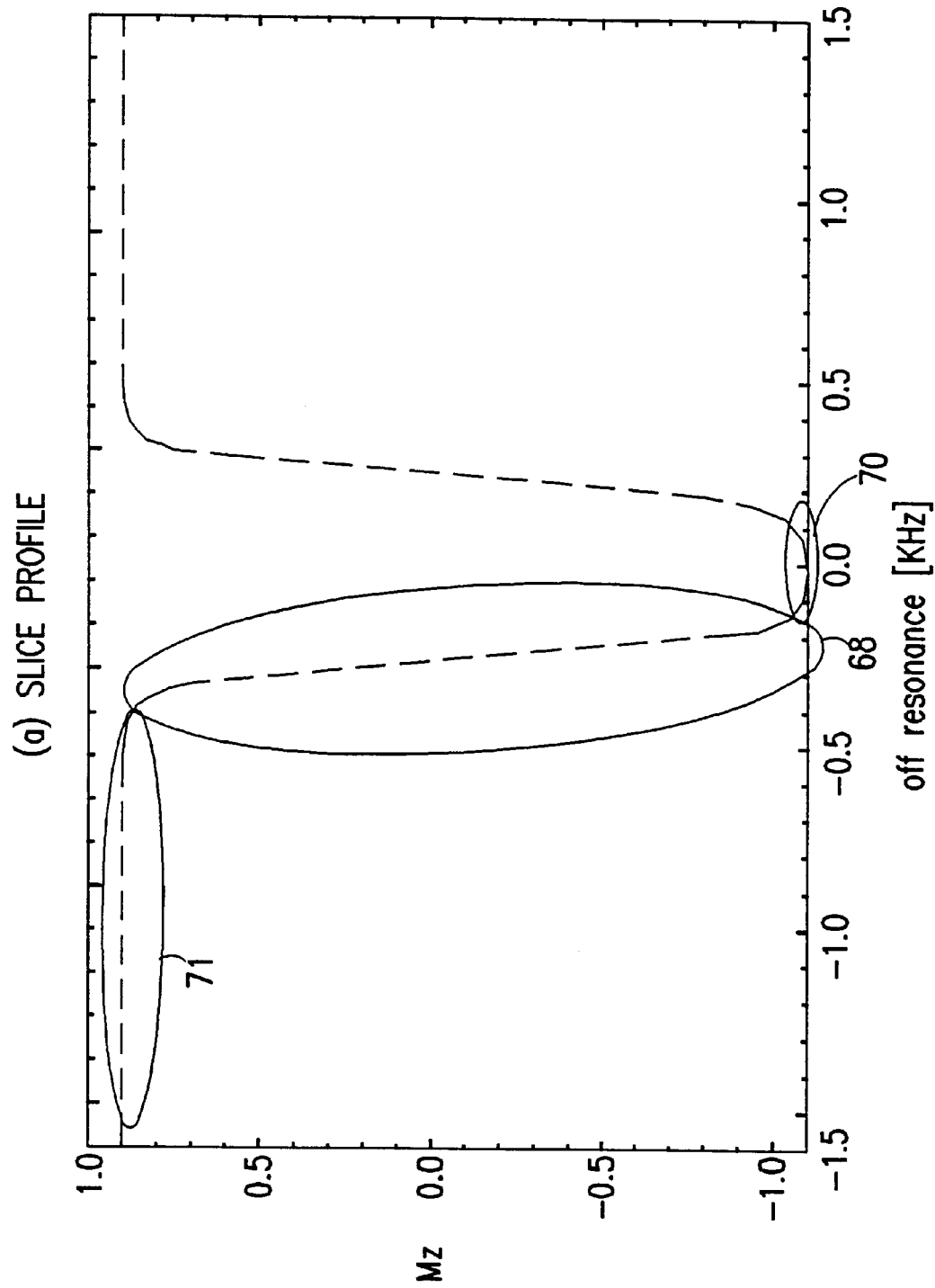
FIG. 9 is a graph of the magnetization effected by a prior art sech/tanh adiabatic FM pulse.

All the trajectories of the pulses which are based on equation (1) have the shape of half an ellipse (for example as shown in FIG. 4). Thus, the difference between symmetric and asymmetric pulses is not in the trajectory but in the temporal profile of the angular velocity $\dot{\theta}$ of $B_{eff}$. In a symmetrical pulse, $\dot{\theta}$ changes for the first half of the trajectory in a certain manner and then symmetrically reverses those same changes in the second half of the trajectory. In an asymmetric pulse, $\dot{\theta}$ does not change in a symmetrical manner. For example, $\theta$ might advance faster in the first half of the trajectory as compared to the second half thereof. One half-axis of the ellipse, along the X axis, defines the RF amplitude, where:

$$\omega_{1\max} = \gamma B_{1\max} = \frac{\Omega_0}{2\sqrt{b(a+b)}} \quad (5)$$

The second half-axis of the ellipse, along the Z axis, defines the half-bandwidth of excited off-resonance frequencies, SW/2, where SW is:

$$SW = \frac{ad - bc}{b(a+b)} = \omega_v - \omega_r \quad (6)$$

Although asymmetric pulses are described herein analytically as solutions of the above solution of the Bloch equations, the present invention includes asymmetric pulses which are otherwise generated, either analytically or numerically. Many symmetric adiabatic pulses can be changed into asymmetric adiabatic pulses. In general, if at angles near 0° (+Z) or 180° (–Z) the angular velocity of $B_{eff}$ is low, that transition is narrow, while if the angular velocity is high, that transition is broad.

One example of the creation of an adiabatic asymmetric pulse is increasing the angular velocity of the first 90° of the movement of $B_{eff}$ in a sech/tanh pulse. The result of this change is that the magnetization transition at the low off-resonance frequencies is broader than the transition at the high frequencies and the pulse duration is reduced. Alternatively, an asymmetric pulse may be generated by multiplying the angular velocity profile of a symmetrical pulse by an asymmetrical function. Moreover, this asymmetric function may be optimized, thereby optimizing the angular velocity along the trajectory, to yield the shortest pulse with the sharpest narrow transition (in this case the width of the other transition is immaterial). The angular velocity may be optimized using numerical methods such as mathematical programming, for example involving iterative solution finding. The Bloch equation for each intermediate pulse form may be solved using numerical methods to determine the narrow transition width. The angular velocity is modified, using mathematical programming, in a manner which will reduce the transition width in the next iteration. "Optimization of Adiabatic Selective Pulses," by D. Rosenfeld, S. L. Panfil and Y. Zur, published in *Journal of Magnetic Resonance*, Vol. 126, pp. 221–228 (1997), and "Design of Adiabatic Selective Pulses Using Optimal Control Theory," by D. Rosenfeld and Y. Zur, published in *Magnetic Resonance in Medicine*, Vol. 38, pp. 401–409 (1996), the disclosures of which are incorporated herein by reference, describe optimization methods suitable for inversion pulses as described herein. "Analytical Solutions of the Bloch Equation Involving Asymmetric Amplitude and Frequency Modulations," by D. Rosenfeld, S. L. Panfil and Y. Zur, published in *Physical Review A*, Vol. 54, No. 3, pp. 2439–2443, the disclosure of which is incorporated herein by reference, describes a method of deriving the solution of the Bloch equations.

In one preferred embodiment of the invention, an asymmetric pulse sweeps both forward and backwards, i.e., the angular velocity may be negative. This type of pulse is preferably achieved by multiplying a symmetrical adiabatic pulse by a suitable function. Alternatively or additionally, such a pulse is achieved as a result of optimization.

This process of asymmetrically changing the profile of θ can also be applied to a pulse with a different trajectory from a half ellipse, such as a triangular pulse.

Such a triangular-trajectory pulse is described in "General Solutions for Tailored Modulation Profiles in Adiabatic Excitation", by Thomas E. Skinner and Pierre-Marie L. Robitaille, Journal of Magnetic Resonance, Vol. 98, pp. 14–23, published by Academic Press, Inc., 1992 and in "Adiabatic Excitation Using sin$^2$ Amplitude and cos$^2$ Frequency Modulation Functions," by Thomas E. Skinner and Pierre-Marie L. Robitaille, Journal of Magnetic Resonance Series A, Vol. 103, pp. 34–39, 1993. The disclosure of the above articles is incorporated herein by reference.

In "A New Adiabatic Inversion Pulse", by Daniel Rosenfeld and Yuval Zur, two of the inventors in the instant application, published in "Medical Resonance in Medicine", Vol. 36, pp. 124–136, by Williams and Wilkins in April 1996, the disclosure of which is incorporated herein by reference, a rectangular pulse trajectory is described which may also be converted into a pulse with an asymmetric angular velocity profile, as described above.

In general, an asymmetric pulse may be formed from segments of adiabatic pulses, for example, a first segment of 0°–100° of a sech/tanh pulse and a second segment of 100°–180° of a sin/cos pulse. Any number of adiabatic pulses may be combined in such a manner, including pulses with non-equal trajectories.

In addition, an asymmetric pulse may be created by varying at least one of parameters a, b, c, d, and $\Omega_0$ during the pulse.

One of the advantages of some of the asymmetric pulses over the sech/tanh pulse is their narrow transition width. In FIG. 10A, a v-branch is shown to be the narrower transition. By defining the transition width as the range over which the magnetization changes from 0.95 to –0.95, the transition half-width $\Delta\Omega_v$ is found to be:

$$\Delta\Omega_v = \frac{\eta}{a+b} \tag{7}$$

where $\eta = 1.83/\pi$

To compare the sech/tanh pulse to the hyper-pulse it is necessary to define the actual pulse duration. Theoretically, at the beginning of the pulse $B_{eff}$ is parallel to the Z direction. However, this requires an RF field strength of vanishing size and an infinite pulse duration. In practice, the RF field is truncated below a certain cut-off value, typically 1% of the maximum RF field $\omega_{1max}$. The duration T of a pulse defined according to equation (1) is $$T \cong (a + 2b)\ln\frac{1}{\varepsilon} \tag{8}$$

where $\varepsilon$ is defined such that the 1% cutoff is achieved at least at one of the transitions:

$$\omega_1(\varepsilon) = 0.01\omega_{1max} \tag{9}$$

The solution of equation (9) yields $$\varepsilon(\rho) = 2 \cdot 10^{-6}13\rho + \frac{500013}{40000(\rho+1)+\rho^2} \tag{10}$$

where $\rho = a/b$.

The sech/tanh pulse is a special case of the hyper-solution in which parameter a=0. In the following discussion, parameters relevant to the sech/tanh solution are marked with a superscript s. In this case $\ln(1/\varepsilon)$ is 10.6. Therefore, we can use the same equations to calculate the duration and transition width of a sech/tanh pulse:

$$T^s = 2b^s \cdot 10.6 \tag{11}$$

$$\Delta\Omega^s = \frac{\eta}{a^s + b^s} = \frac{21.2\eta}{T^s} \tag{12}$$

Figure 10B:
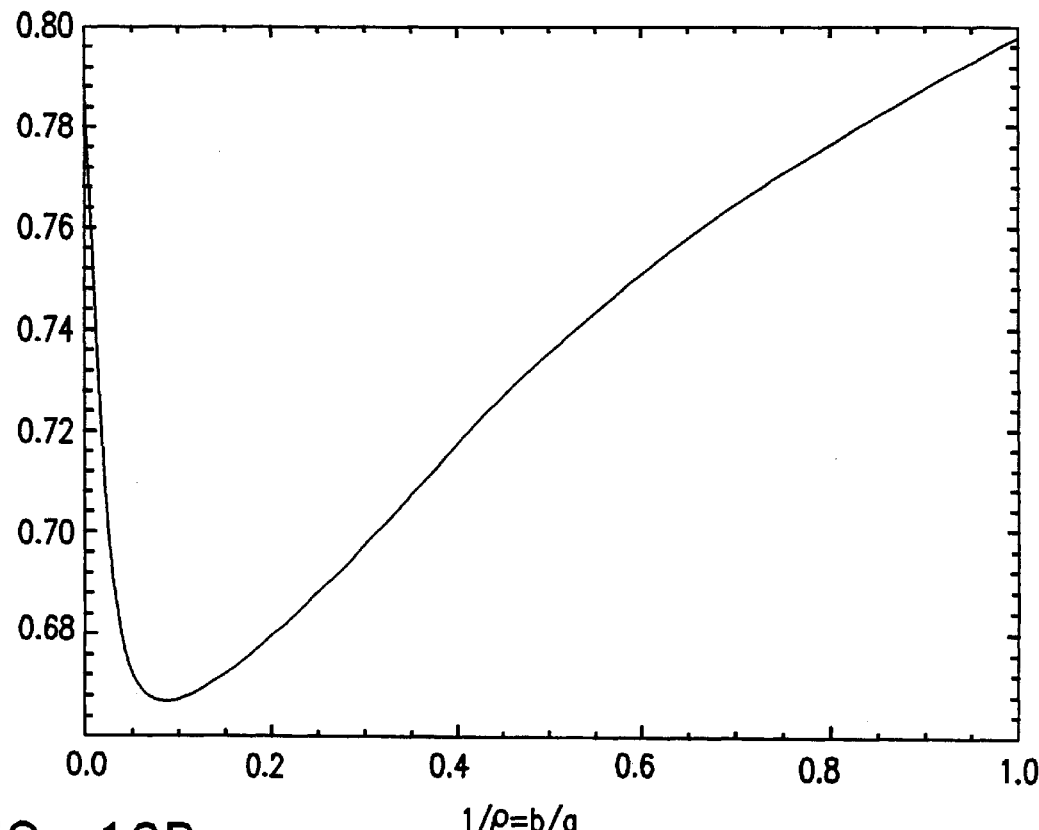
FIG. 10B is a graph showing a ratio between a transition width of a sech/tanh pulse and the narrowest transition width of a hyper-pulse as a function of various parameters of the hyper-pulse.

FIG. 10B shows the ratio between $\Delta\Omega^s$ and $\Delta\Omega_v$ as a function of $1/\rho$, which ratio is defined as Q by the following equation:

$$Q = \frac{\Delta\Omega_v}{\Delta\Omega^s} = \frac{\rho+2}{21.2(\rho+1)}\ln\frac{1}{\varepsilon(\rho)} \tag{13}$$

The minimum ratio Q is at $\rho \equiv 11.09$, where $Q \equiv 0.67$. Thus, a hyper-pulse can achieve one transition narrower by ⅓ than a sech/tanh pulse of similar duration. It should be noted that Q is lower than one for a wide range of values of $\rho$. When $\rho$ is between 1 and 1000, Q is still less than 0.8 and when $\rho$ is between 5 and 500 Q is less than 0.68.

Equation (7) can be used to determine the values of the pulse parameters required to achieve a certain transition width. No less important is setting the pulse parameters to achieve a certain inverted bandwidth $\Delta\Omega$. The following equation describes the relationship between the inverted bandwidth and the pulse parameters:

$$\Delta\Omega = \Omega_v - \Omega_r = \frac{ad - bc - \eta(a + 2b)}{b(a+b)} \quad (14)$$

The following example shows how to design a fat suppression pulse, using equations (5) and (14) in a 2 Tesla MRI system. The requirements of the pulse are:

Transition width: $2\Delta\Omega_v$=130 Hz

Inverted bandwidth: $\Delta\Omega$=300 Hz

And, since an efficient pulse is desired:

ρ=11.09

From equations (8) and (10), T, the pulse duration, is found to be:

$$T = b(\rho + 2)\ln\frac{1}{\varepsilon(\rho)} = 171.33b \quad (15)$$

$\Delta\Omega_v$ can be found from equations (7) and (15):

$$\Delta\Omega_v = \frac{\eta}{a+b} = \frac{8.25}{T} \Rightarrow \frac{\Delta\Omega_v}{2\pi} \cong \frac{1.3}{T} \text{ [Hz]} \quad (16)$$

Since $\Delta\Omega_v/2\pi$=65 Hz in our case, therefore, T=20 ms. The values of a and b can be readily determined:

$$b = \frac{T}{171.33} \cong 0.12 \quad (17)$$

Parameters c and d can then be derived from equation (14), when ρ=11.09:

$$\Delta\Omega = \frac{ad - bc - \eta(a + 2b)}{b(a+b)} = \quad (18)$$

$$\frac{1}{b}\rho d - c - \frac{\eta(\rho + 2)}{1 + \rho} \Rightarrow \frac{\Delta\Omega}{2\pi} = \frac{2.255}{T}(-c + 11.09d - 7.625)$$

To determine exact values for parameters c and d another constraint is required. The following equation defines a constraint that the inverted bandwidth is centered around the Larmor frequency, although other constraints may be used without affecting the generality of the example:

$$\frac{1.13}{T}(-c - 13.09d + 6.46) = 0 \quad (19)$$

Solving equations (18) and (19) yields c=−2.6 and d=0.692. The last parameter, $\Omega_0$, is determined from equation (5) which defines the peak RF amplitude $f_{max}$:

$$2\pi f_{max} \equiv \omega_{1max} = \frac{\Omega_0}{2b\sqrt{1+\rho}} \Rightarrow f_{max} = \frac{\Omega_0 24.64}{2\pi T} \quad (20)$$

By choosing a (typical) value of $f_{max}$ of 1 kHz (which is above the threshold of adiabaticity, as shown later with reference to FIG. 12), $\Omega_0$=5.1.

Figure 11:
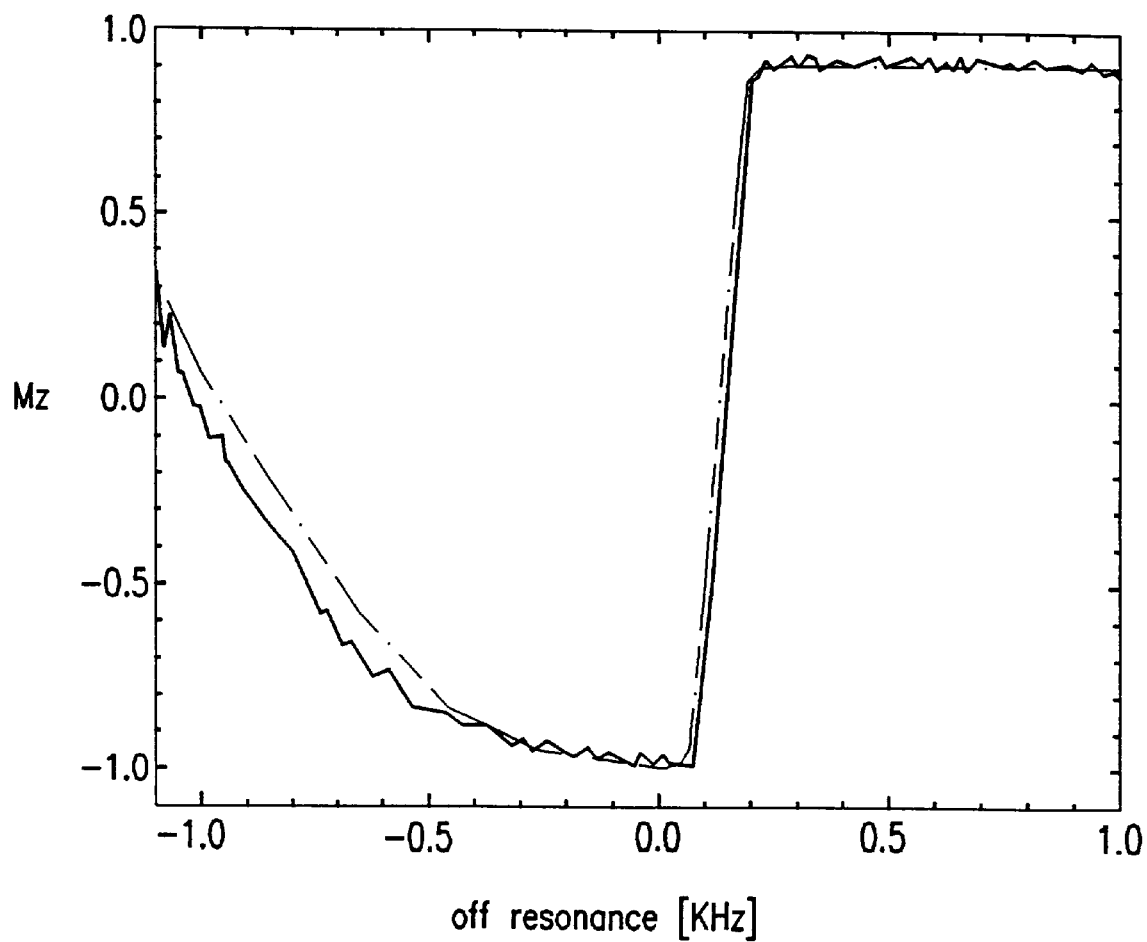
FIG. 11 is a graph showing a result of a magnetization experiment using a pulse in accordance with a preferred embodiment of the invention.

FIG. 11 shows the results of a test application of the instant fat suppression pulse on an Elscint Prestige 2T system, marketed by Elscint LTD, Haifa Israel. The dashed line denotes the calculated final magnetization distribution resulting from the pulse, while the solid line denotes the actual final magnetization distribution.

Referring back to equations (1) and (2), the pulse modulation function in equation (1) is a function of z. However, equation (2) which maps t to z cannot normally be analytically inverted to obtain modulation functions based on t. Thus, implementation of the pulses on a real imaging device may require certain modifications. Usually, a pulse is implemented using N equally spaced (in time) samples of the desired pulse.

One, preferred method, of obtaining these N samples in the above example is as follows: After determining the values of the pulse parameters, ϵ is determined from equation (10). 10N equally spaced values of z are selected in the range ϵ to 1-ϵ. 10N corresponding values of t are calculated using equation (2). Then, N values of z are interpolated using the above values and which correspond to N equally spaced values of t. Thereafter, the pulse modulation functions are calculated from equation (1) using the N interpolated z values.

An important advantage of the hyper-pulse over a sech/tanh pulse is that a pulse of similar duration can achieve a sharper transition (on one side thereof). Likewise, to achieve an equally sharp transition, a hyper-pulse can be shorter than a corresponding sech/tanh pulse. The pulse duration is inversely proportional to the transition width (for example equation 16), so a tradeoff may be effected between the duration and the transition width. For example, when ρ=11.09 (sharpest possible transition), the ratio $T_{hyper}/T^s$ is about 0.67 if the two transition widths are equal. Thus, in the above fat suppression example, a sech/tanh pulse would require 30 milliseconds instead of 20 milliseconds to achieve the same sharpness of transition. Shortening the duration of MRI imaging sequences is important since it increases the throughput of MRI devices. A fat suppression pulse in accordance with a preferred embodiment of the invention may be used in multi-slice spin-echo (SE) and fast spin-echo (FSE) imaging, where the pulse duration is of utmost importance, since the fat suppression pulse is applied very often. Even in fast MRI sequences, an inversion pulse is applied periodically, in which case using a hyper pulse may shorten the imaging time. In a STIR (short T1 inversion-recovery) with fat suppression imaging sequence a fat inversion pulse is applied very frequently, so a considerable amount of time may be saved by using a hyperpulse.

Alternatively or additionally to shortening the pulse duration or decreasing the transition width, the MRI system requirements may be reduced. For example, the slope of the gradient created by the Z gradient coils may be reduced, while maintaining a similar slice selectivity. Alternatively, a weaker static field (low field) may be used without compromising the imaging resolution. For example, in a 0.5 Tesla system, the frequency difference between water and fat is only about 10 Hz, so that pulses of long duration are required for fat suppression.

Figure 12B:
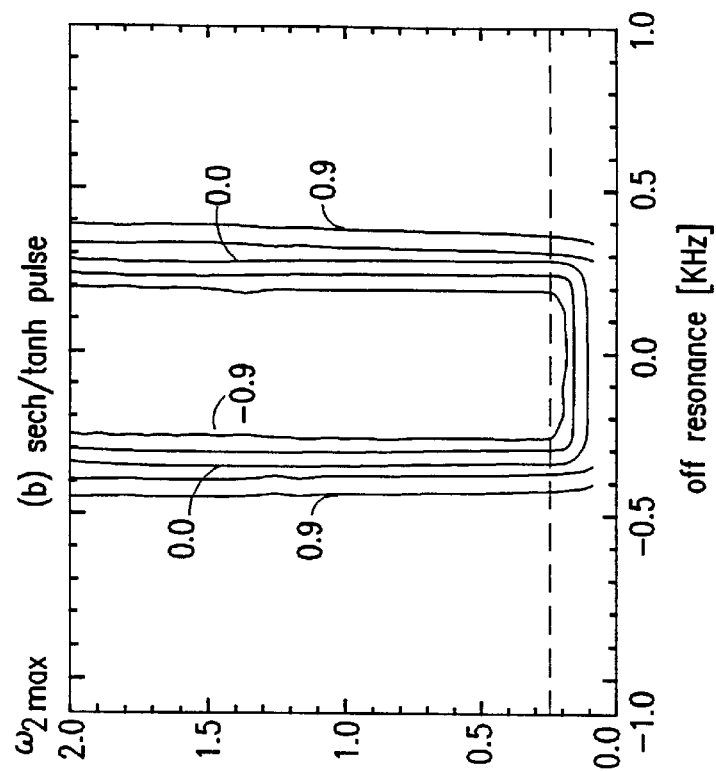
FIG. 12B is a graph showing the magnetization effect of a sech/tanh-pulse as a function of the maximal RF magnetic-field strength and showing the threshold for adiabaticity of the pulse.
Figure 12A:
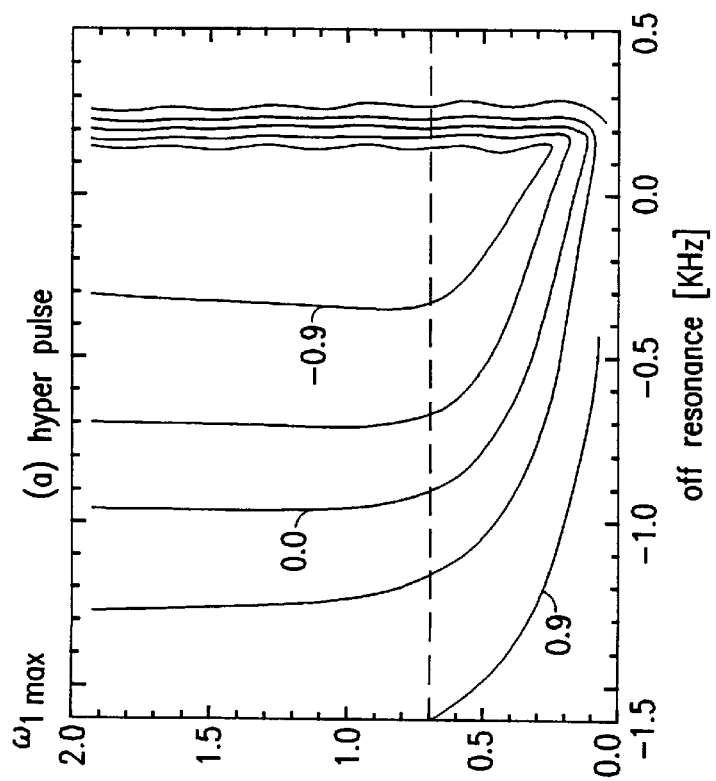
FIG. 12A is a graph showing the magnetization effect of a hyper-pulse as a function of the maximal RF magnetic-field strength and showing the threshold for adiabaticity of the pulse.

FIG. 12A is a graph showing the magnetization effect of the hyper-pulse described in the above example as a function of the maximal RF magnetic-field strength. This graph was obtained by plotting contours of the longitudinal magnetization at the end of the pulse at each off-resonance frequency in the presence of field imperfections. The narrow transition is on the right side of the graph.

FIG. 12B is a graph showing the magnetization effect of a sech/tanh-pulse as a function of the maximal RF magnetic-field strength. The dashed lines in FIGS. 12A and B indicate the threshold of adiabaticity. Above these dashed lines, the inversion pulses are substantially insensitive to RF field inhomegenities. The insensitivity is manifested in the slope of the equal-magnetization contours, which slope is substantially infinite, indicating that the magnetization is not affected by the $B_1$ field strength. It should be noted that the threshold for the hyper-pulse was 650 Hz, while the threshold for the corresponding sech/tanh pulse was only 250 Hz. The maximum achievable RF amplitude is a limitation of the equipment, usually a power amplifier limitation.

The SAR (specific absorption rate), which is a measure of the RF radiation absorbed by the patient, is also an important parameter. This is especially true in high field strength MRI devices. The SAR depends on the number of times per second that the particular pulse is applied. In some applications, for example, in spin-echo imaging, when the hyper-pulse is used for fat suppression, the hyper-pulse is not repeated very often, so the increase in SAR is small. If the hyper-pulse is compared to a sech/tanh pulse of similar duration (20 milliseconds) at the threshold frequencies (650 Hz and 250 Hz respectively), the ratio between the energies $E_{hyper}/E_{sech/tanh}$ is about 2.5.

Figure 13A:
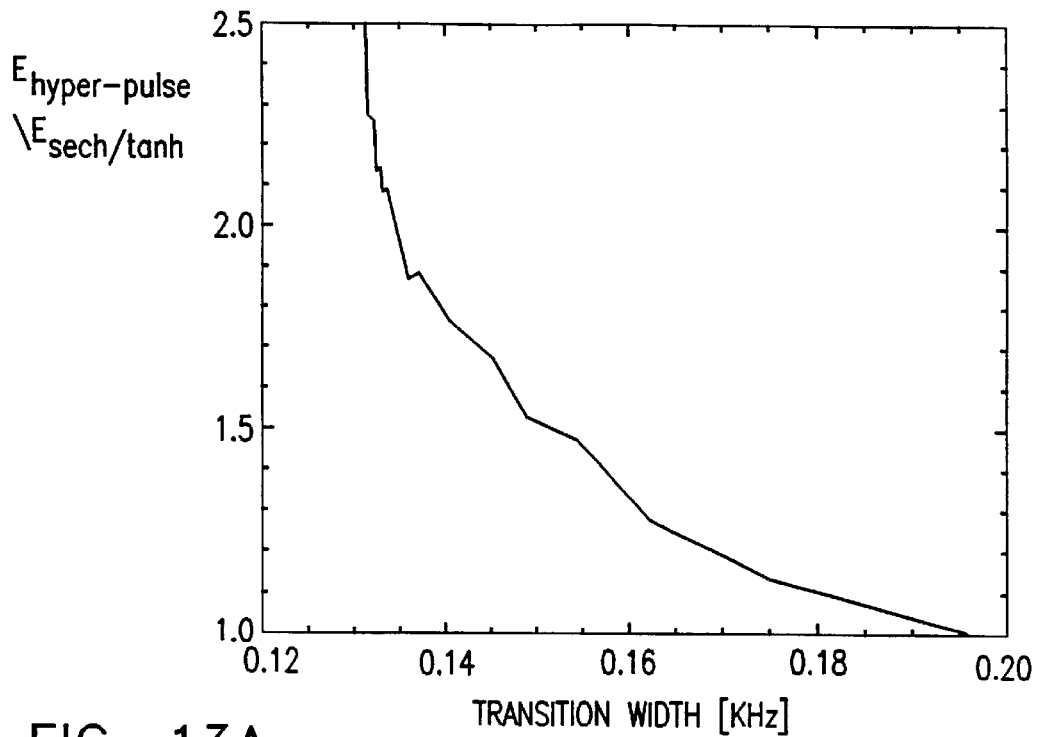
FIG. 13A is a graph showing the effect of reducing the SAR (specific absorption rate) of a pulse, in accordance with the present invention, on a transition width thereof.
Figure 13B:
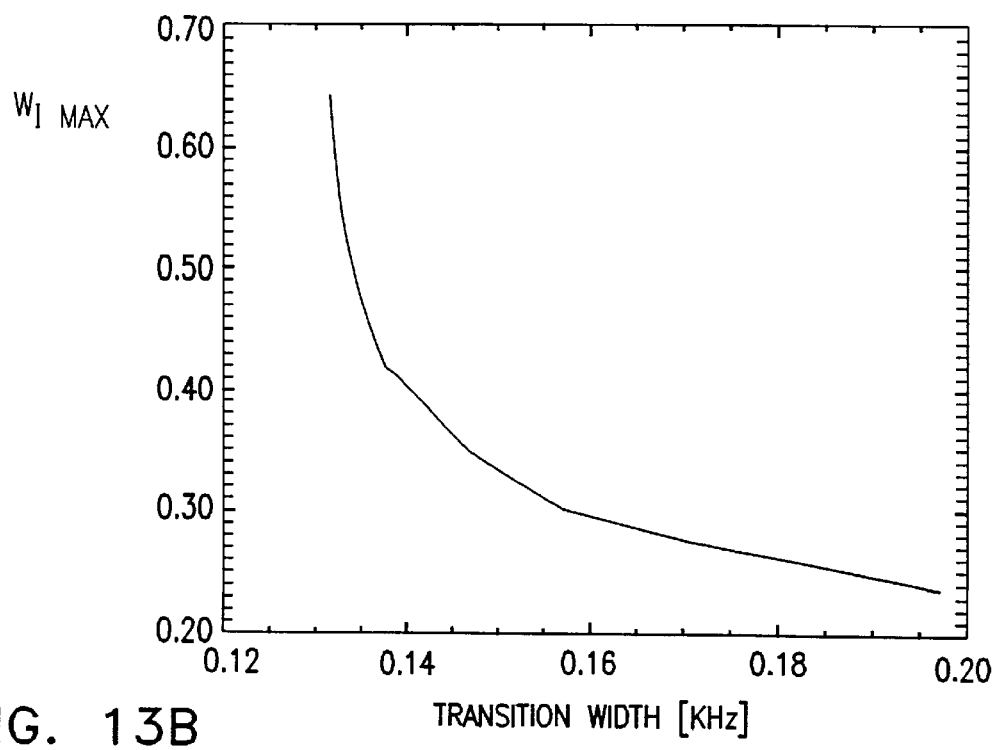
FIG. 13B is a graph showing the effect of reducing the peak amplitude of a pulse, in accordance with the present invention, on a transition width thereof.
Figure 14:
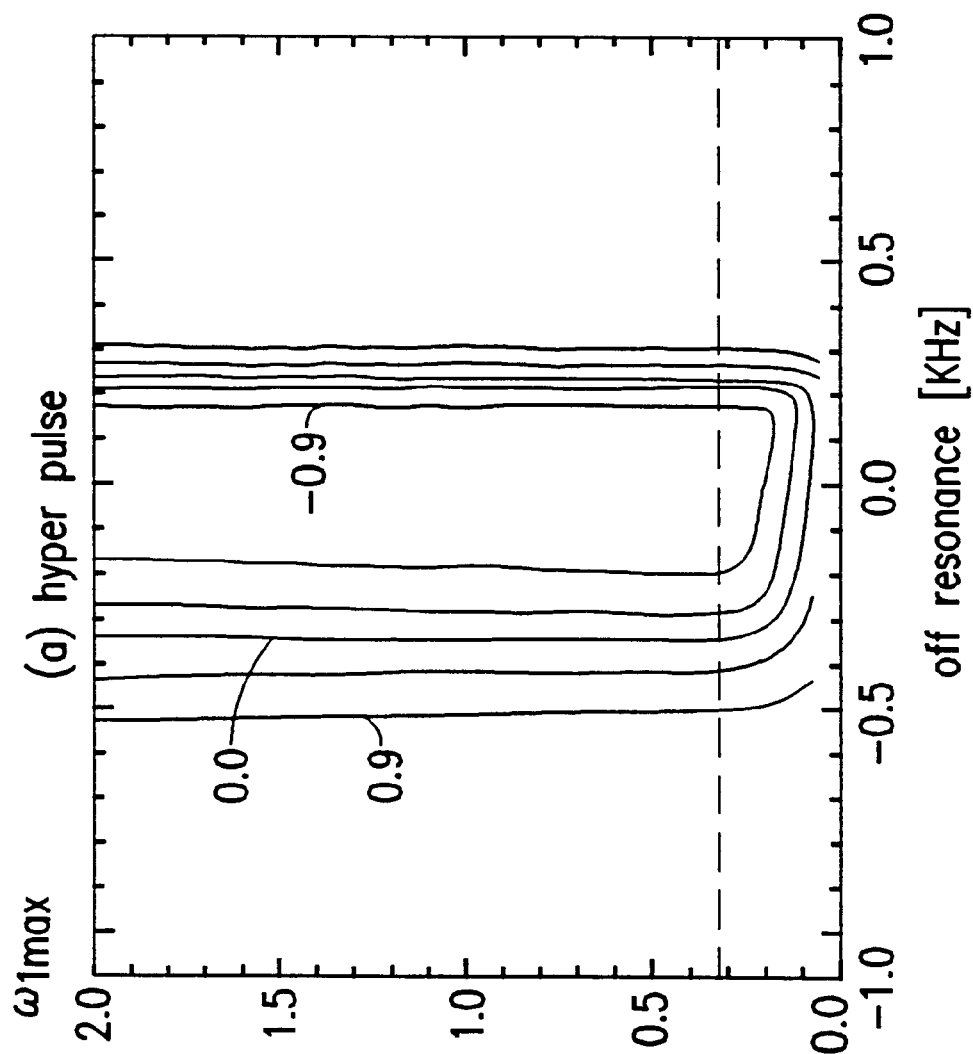
FIG. 14 is a graph, similar to that of FIG. 12A, except that the transition is slightly broader, and showing the effect of an increase of the transition width on the threshold of adiabaticity.

The inventors have found that if the transition width of the hyper-pulse is slightly compromised, i.e., increased, the ratio between the energies is significantly reduced. FIG. 13A shows the relationship between the transition widths and the ratio between the energies. FIG. 13B shows the relationship between the transition width and the ratio between the peak RF amplitudes (marked as $W_{Imax}$). For example, increasing the transition width to 150 Hz (15% from the baseline) reduces the energy ratio by 60% (FIG. 13A) and the peak required RF amplitude is reduced by about half (FIG. 13B). FIG. 14 (which corresponds to FIG. 12A) shows the effect of slightly increasing the transition width (of the narrow, right handed transition) on the peak RF threshold for adiabaticity. The adiabaticity threshold (dashed line) in FIG. 14 is clearly lower than in FIG. 12A. In this example, the narrow transition is made wider by changing its width tradeoff with the wide transition, as a result, the wide transition is made narrower.

In low field systems SAR is usually not a limiting factor. In such systems, narrow transition pulses are usually of long duration and may be impractical due to $T_2$ relaxation effects. Pulses in accordance with the present invention are especially useful, since, being shorter, they are less affected by $T_2$ relaxation.

It should be appreciated that the present invention is not limited to what has thus far been described with reference to preferred embodiments of the invention. Rather, the scope of the present invention is limited only by the claims which follow.

What is claimed is:

1. A method of NMR (nuclear magnetic resonance) excitation of a sample having a magnetic moment comprising:
    applying a longitudinal magnetic field to the sample;
    inverting the magnetization of at least a portion of the sample, using an FM pulse having a duration, wherein the FM pulse has asymmetrical characteristics, wherein a resulting magnetization profile $M_z$ of the sample has an asymmetric characteristic, comprising at least a narrow transition and a broad transition, and wherein the magnetization profile has the formula:

$$M_z = \frac{\sinh\pi r \sinh\pi v + \cos 2\pi q}{\cosh\pi r \cosh\pi v}$$

wherein $$r = d - \omega_0 b$$
$$v = (c + d) - \omega_0(a + b)$$
$$q = \frac{1}{2}\sqrt{\Omega_0^2 - (c - \omega_0 a)^2}$$

wherein a, b, c, d and $\Omega_0$ are parameters having real values, $\omega_0$ is the Larmor frequency and wherein $a \neq 0$, and ($c \neq 0$ or $d \neq 0$), wherein if q is imaginary, $$M_z = \frac{\sinh\pi r \sinh\pi v + \cosh 2\pi |q|}{\cosh\pi r \cosh\pi v}$$

2. A method according to claim 1, wherein the pulse is analytically defined.

3. A method in accordance with claim 1, wherein the width of the narrow transition is less than 0.9 of the width of a transition of a sech/tanh pulse having a similar duration and a narrowest possible transition.

4. A method in accordance with claim 1, wherein the width of the narrow transition is less than 0.75 of the width of a transition of a sech/tanh pulse having a similar duration and a narrowest possible transition.

5. A method in accordance with claim 1, wherein the width of the narrow transition is less than 0.68 of the width of a transition of a sech/tanh pulse having a similar duration and a narrowest possible transition.

6. A method in accordance with claim 1, wherein the duration of the pulse is less than 0.9 of the duration of a sech/tanh pulse having a similar transition width thereto.

7. A method in accordance with claim 1, wherein the duration of the pulse is less than 0.75 of the duration of a sech/tanh pulse having a similar transition width thereto.

8. A method in accordance with claim 1, wherein the duration of the pulse is less than 0.68 of the duration of a sech/tanh pulse having a similar transition width thereto.

9. A method of NMR (nuclear magnetic resonance) excitation of a sample having a magnetic moment and comprising a first material having nuclei associated thereto and at least a second material having nuclei associated thereto, comprising:
    selectively changing the magnetic moment of only the nuclei associated with the first material using the method of claim 1.

10. A method in accordance with claim 9, comprising:
    applying an NMR/MRI sequence to the sample after the magnetic moment of the nuclei associated with the first material is substantially zero.

11. A method in accordance with claim 9, wherein the first material consists essentially of fat.

12. A method in accordance with claim 9, wherein the first material consists essentially of water.

13. A method in accordance with claim 9, wherein the first material consists essentially of silicon.

14. A method of NMR (nuclear magnetic resonance) of a sample having a magnetic moment comprising:
    applying a longitudinal magnetic field to the sample;
    inverting the magnetization of at least a portion of the sample, using an FM pulse having a duration, wherein the FM pulse has asymmetrical characteristics, and changing the magnetic moment in a substantially continuous manner by moving an effective magnetic field vector more than 90°+α, wherein for all portions of the sample in which the moment is changed, the angular velocity of the effective field vector at at least one angle, 90°+α, is different from the angular velocity at 90°−α;

wherein moving the magnetic-field vector comprises applying an FM pulse and wherein vector $\omega_e$ has components $\omega_x$, $\omega_y$ and $\omega_z$ and wherein said changing comprises changing according to the following formula:

$$\omega_x = \omega_1 = \Omega_0 (z(1-z))^{0.5}/(az+b)$$

$$\omega_y = 0$$

$$\omega_z = \omega - \omega_o = \frac{cz+d}{az+b} - \omega_0$$

wherein, the frame of reference for the formula is a frame rotating at the instantaneous frequency of the FM pulse and wherein z is selected from the range 0 to 1 and wherein a time variable t is given by:

$$t = \ln \frac{z^b}{(1-z)^{a+b}}$$

15. A method according to claim 14, wherein at the angular velocity at at least 10% of the angular movement of the effective magnetic field vector is not mirrored about 90°.

16. A method according to claim 14, wherein at the angular velocity at at least 20% of the angular movement of the effective magnetic field vector is not mirrored about 90°.

17. A method according to claim 14, wherein at the angular velocity at at least 40% of the angular movement of the effective magnetic field vector is not mirrored about 90°.

18. A method according to claim 14, wherein at the angular velocity at at least 70% of the angular movement of the effective magnetic field vector is not mirrored about 90°.

19. A method according to claim 14, wherein changing the moment comprises rotating the moment by approximately 180 degrees, for at least some of the sample.

20. A method according to claim 19, wherein the effective field vector transverses a trajectory and wherein the trajectory is asymmetric.

21. A method in accordance with claim 14, wherein $c \neq 0$ or $d \neq 0$.

22. A method in accordance with claim 14, wherein changing the moment comprises, moving the effective magnetic field vector both forwards and backwards.

23. A method in accordance with claim 14, comprising, detecting RF radiation emitted by the sample.

24. A method of NMR (nuclear magnetic resonance) excitation of a sample having a magnetic moment, comprising:

applying a longitudinal magnetic field to the sample;

changing the magnetic moment in a continuous manner using an FM pulse; and varying an effective magnetic-field vector $\omega_e$ having components $\omega_x$, $\omega_y$ and $\omega_z$ and associated with the FM pulse, according to the following formula:

$$\omega_x = \omega_1 = \Omega_0 \frac{\sqrt{z(1-z)}}{az+b}$$

$$\omega_y = 0$$

$$\omega_z = \omega - \omega_0 = \frac{cz+d}{az+b} - \omega_0$$

wherein, the frame of reference for the formula is a frame rotating at the instantaneous frequency of the FM pulse and wherein z is selected from the range 0 to 1 and wherein a time variable t is given by:

$$t = \ln \frac{z^b}{(1-z)^{a+b}}$$

wherein a, b, c, d and $\Omega_0$ are parameters having real values and wherein $a \neq 0$, and ($c \neq 0$ or $d \neq 0$).

25. A method in accordance with claim 24, wherein $1 \leq a/b \leq 1000$.

26. A method in accordance with claim 24, wherein $5 \leq a/b \leq 500$.

27. A method in accordance with claim 24, wherein a/b is substantially equal to 11.09.

* * * * *